(12) United States Patent
Stockinger et al.

(10) Patent No.: US 8,456,784 B2
(45) Date of Patent: Jun. 4, 2013

(54) OVERVOLTAGE PROTECTION CIRCUIT FOR AN INTEGRATED CIRCUIT

(75) Inventors: Michael A. Stockinger, Austin, TX (US); Chris C. Dao, Pflugerville, TX (US); Dale J. McQuirk, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 441 days.

(21) Appl. No.: 12/772,769

(22) Filed: May 3, 2010

(65) Prior Publication Data

US 2011/0267723 A1  Nov. 3, 2011

(51) Int. Cl.
*H02H 9/00* (2006.01)
*H01L 27/02* (2006.01)

(52) U.S. Cl.
CPC .................................. *H01L 27/0285* (2013.01)
USPC ............................................. 361/56; 361/111

(58) Field of Classification Search
USPC .......................................... 361/56, 91.1, 111
See application file for complete search history.

(56) References Cited

U.S. PATENT DOCUMENTS

| | | | |
|---|---|---|---|
| 5,508,649 A * | 4/1996 | Shay | 327/318 |
| 5,917,689 A | 6/1999 | English et al. | |
| 6,385,021 B1 | 5/2002 | Takeda et al. | |
| 6,724,601 B2 * | 4/2004 | Lien et al. | 361/111 |
| 6,724,603 B2 | 4/2004 | Miller et al. | |
| 6,760,209 B1 | 7/2004 | Sharpe-Geisler | |
| 7,245,468 B2 | 7/2007 | Greisbach et al. | |
| 7,522,395 B1 * | 4/2009 | Tien et al. | 361/56 |
| 2007/0115600 A1 * | 5/2007 | Lohr et al. | 361/111 |
| 2007/0285854 A1 | 12/2007 | Rodgers et al. | |
| 2009/0040671 A1 | 2/2009 | Zhang | |
| 2009/0067104 A1 | 3/2009 | Stockinger et al. | |

OTHER PUBLICATIONS

International Application No. PCT/US2011/031183, Search Report and Written Opinion dated Apr. 5, 2011.

* cited by examiner

*Primary Examiner* — Rexford Barnie
*Assistant Examiner* — Tien Mai
(74) *Attorney, Agent, or Firm* — Daniel D. Hill

(57) ABSTRACT

An overvoltage protection circuit may include a reference voltage generator, a trigger circuit, and a clamping device. The reference voltage generator is for providing a reference voltage that is relatively constant during a powered EOS/ESD event. The trigger circuit is coupled to receive the reference voltage and a power supply voltage. The trigger circuit is for comparing the reference voltage to the power supply voltage. In response to detecting that the power supply voltage is above the reference voltage, the trigger circuit provides a trigger signal having a voltage proportional to a voltage level of the overvoltage event. The clamping device is coupled between a first power supply terminal and a second power supply terminal. The clamping device is for providing a current path between the first and second power supply terminals in response to the trigger signal.

16 Claims, 4 Drawing Sheets

OVERVOLTAGE PROTECTION CIRCUIT FOR AN INTEGRATED CIRCUIT

BACKGROUND

1. Field

This disclosure relates generally to overvoltage protection circuits, and more specifically, to an overvoltage protection circuit for an integrated circuit.

2. Related Art

Electronic parts, such as integrated circuits, can experience both electrical overstress (EOS) and electrostatic discharge (ESD) events. Both EOS and ESD events (also referred to as "overvoltage events") can damage circuitry that may be sensitive to these events by exposing the circuitry to an overvoltage. Traditionally, circuits that are designed to protect against ESD events that occur when the integrated circuit is turned off, may not protect against EOS and ESD events that occur when the integrated circuit is already powered on.

Accordingly, there is a need for an improved overvoltage protection circuit for an integrated circuit that can protect the integrated circuit from EOS and ESD events even when the integrated circuit is already powered on. In addition, there is a need to ensure that the integrated circuit stays in operation during the EOS/ESD event, i.e., the supply voltage must not collapse to a level that it resets the integrated circuit.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
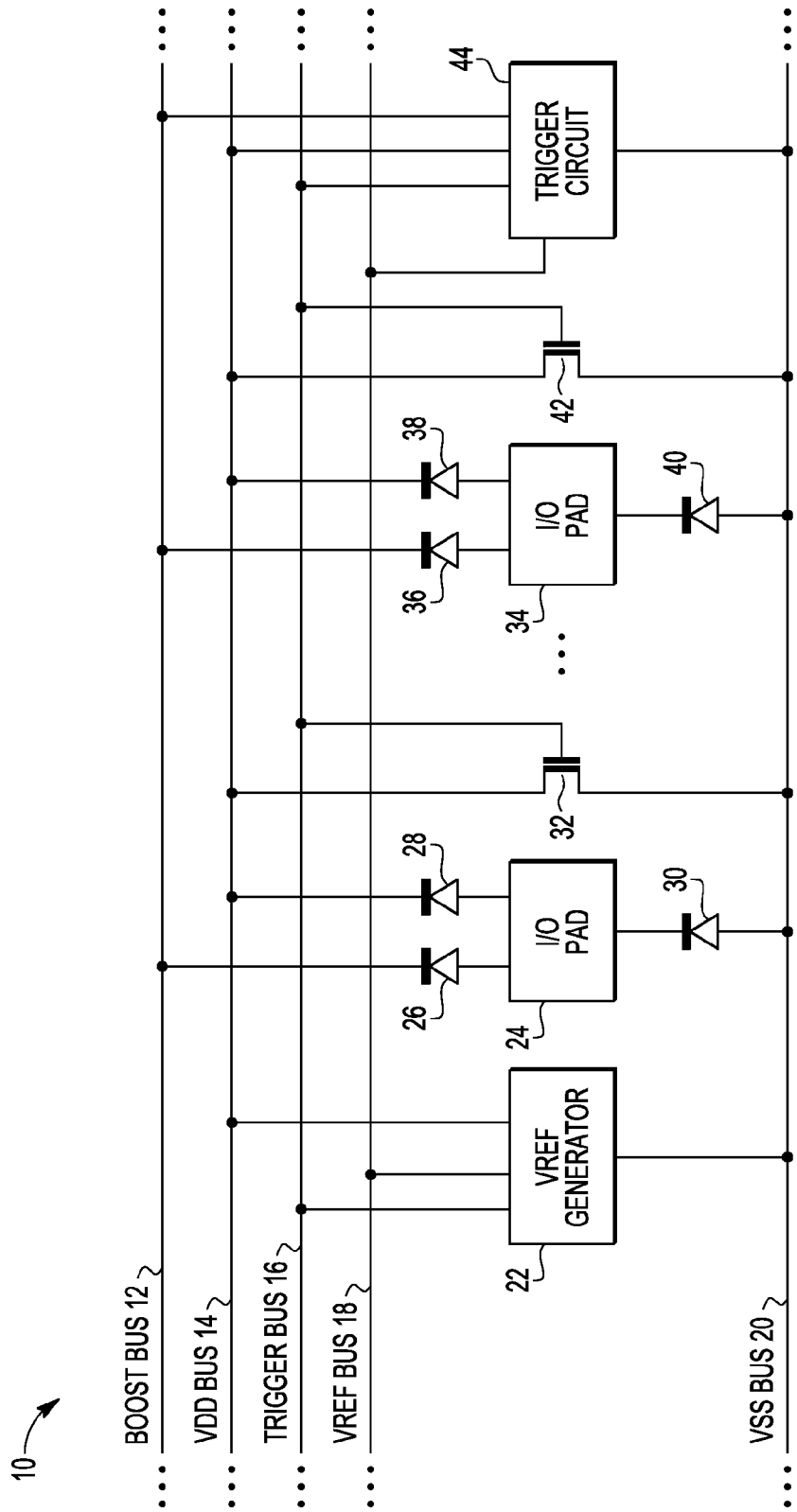
FIG. 1 is a block diagram of an exemplary overvoltage protection circuit for an integrated circuit.

In one aspect, an overvoltage protection circuit, including a reference voltage generator for providing a reference voltage that is relatively constant during an overvoltage event, is provided. The overvoltage protection circuit may further include a trigger circuit coupled to receive the reference voltage and a first power supply voltage, the trigger circuit for comparing the reference voltage to the first power supply voltage, and in response to detecting that the first power supply voltage is above the reference voltage, the trigger circuit providing a trigger signal having a voltage proportional to a voltage level of the overvoltage event. As used herein the term "proportional" is not limited to cases with a linear relationship between two quantities, but includes cases where an increase in the first quantity causes an increase in the second quantity or a decrease in the first quantity causes a decrease in the second quantity. The overvoltage protection circuit may further include a clamping device coupled between a first power supply terminal (or "bus") and a second power supply terminal (or "bus"), the clamping device for providing a current path between the first and second power supply terminals in response to the trigger signal.

In another aspect, an overvoltage protection circuit, including a reference voltage generator for providing a reference voltage that is a filtered voltage of a power supply voltage, is provided. The filter may suppress fast changes ("transients") in the reference voltage and therefore may provide a measure of the power supply voltage averaged over a certain time period. The overvoltage protection circuit may further include a trigger circuit coupled to receive the reference voltage and a first power supply voltage, the trigger circuit for comparing the reference voltage to the first power supply voltage, and in response to detecting that the first power supply voltage is above the reference voltage, the trigger circuit providing a trigger signal having a voltage proportional to a voltage level of the overvoltage event. The overvoltage protection circuit may further include a clamping device having a first terminal coupled to a first power supply terminal (or "bus"), a second terminal coupled to a second power supply terminal (or "bus"), and a control terminal coupled to receive the trigger signal, the clamping device for providing a current path between the first and second power supply terminals in response to the trigger signal.

In yet another aspect, an overvoltage protection circuit, including a plurality of input/output terminals, is provided. The overvoltage protection circuit may further include a plurality of trigger circuits, each of the plurality of trigger circuits corresponding to a predetermined number of the plurality of input/output terminals, wherein each of the trigger circuits is coupled to receive a reference voltage and a first power supply voltage, the trigger circuit for comparing the reference voltage to the first power supply voltage, and in response to detecting that the first power supply voltage is above the reference voltage, each of the trigger circuits providing a trigger signal having a voltage proportional to a voltage level of the overvoltage event. The overvoltage protection circuit may further include a plurality of clamping devices, each of the plurality of clamping devices having a first terminal coupled to a first power supply terminal (or "bus"), a second terminal coupled to a second power supply terminal (or "bus"), and a control terminal coupled to receive the trigger signal, the plurality of clamping devices for providing a current path between the first and second power supply terminals in response to the trigger signal.

FIG. 1 is a block diagram of an exemplary overvoltage protection circuit 10 for an integrated circuit. In one embodiment, the various elements of overvoltage protection circuit 10 may be contained in the I/O pad ring of the integrated circuit. By way of example, overvoltage protection circuit 10 may sense both powered and un-powered EOS/ESD events at specific points along the I/O pad ring. Un-powered ESD events may include events, such as a human body model (HBM) event, a charged device model (CDM) event, and a machine model (MM) event. Un-powered ESD events occur when the integrated circuit is not powered up, i.e. no power is supplied to operate the integrated circuit in a normal, powered-up mode during the event. Powered EOS/ESD events may include events such as, a system level ESD event, an electrical fast transient (EFT) event, a ring wave event, and a power surge event. Powered EOS/ESD events occur when the integrated circuit is powered up, i.e. power is supplied to operate the integrated circuit in a normal, powered-up mode during the event. In response to detecting EOS/ESD events, overvoltage protection circuit 10 can turn on clamp devices, such as clamp transistors distributed within the I/O pad ring and thereby shunt current between the VDD and VSS power supply buses. This protects sensitive circuitry on the integrated circuit from being damaged. By way of example, an EOS/ESD event is detected by comparing a voltage, such as the voltage on the VDD bus, to a reference voltage. If the voltage on the VDD bus exceeds the reference voltage, then the clamps are turned on in proportion to the detected overvoltage.

With continued reference to FIG. 1, overvoltage protection circuit 10 may include a BOOST bus 12, a VDD bus 14, a TRIGGER bus 16, a VREF bus 18, and a VSS bus 20. As used herein, the term "bus" includes the use of only one conductor or more than one conductor for carrying a signal or a supply voltage. Overvoltage protection circuit 10 may further include a reference voltage generator 22. Overvoltage protection circuit 10 may further include I/O pads 24 and 34. Overvoltage protection circuit 10 may further include clamp transistors 32 and 42. Overvoltage protection circuit 10 may further include a trigger circuit 44. Reference voltage generator 22 may be coupled to VDD bus 14 and VSS bus 20. Reference voltage generator 22 may further be coupled to TRIGGER bus 16 and VREF bus 18. I/O pad 24 may be coupled via diode 26 to BOOST bus 12. I/O pad 24 may further be coupled via diode 28 to VDD bus 14. I/O pad 24 may further be coupled via diode 30 to VSS bus 20. I/O pad 34 may be coupled via diode 36 to BOOST bus 12. I/O pad 34 may further be coupled via diode 38 to VDD bus 14. I/O pad 34 may further be coupled via diode 40 to VSS bus 20. Although FIG. 1 shows only two I/O pads and their respective couplings, overvoltage protection circuit 10 may include more I/O pads and their respective couplings. The gate terminal of each of clamp transistors 32 and 42 may be coupled to TRIGGER bus 16. One current terminal of each of clamp transistors 32 and 42 may be coupled to VDD bus 14 and the other current terminal of each of clamp transistors 32 and 42 may be coupled to VSS bus 20. Clamp transistors 32 and 42 may act as clamp devices. Trigger circuit 44 may be coupled to each of BOOST bus 12, VDD bus 14, TRIGGER bus 16, VREF bus 18, and VSS bus 20.

In one embodiment, voltage reference generator 22 generates a reference voltage that is input to trigger circuit 44. The reference voltage is also the voltage on VREF bus 18, as the output of voltage reference generator 22 is coupled to VREF bus 18. In one embodiment, voltage reference generator 22 may generate a reference voltage that is relatively constant when the integrated circuit is powered on and during a powered EOS/ESD event. Such reference voltage may be generated using a band-gap reference voltage generator. In another embodiment, voltage reference generator 22 may generate a reference voltage by filtering the voltage on VDD bus 14 (VDD bus voltage). Trigger circuit 44 compares the voltage on BOOST bus 12 (BOOST bus voltage) to the reference voltage and generates a TRIGGER signal in proportion to the difference between the BOOST bus voltage and the reference voltage. Alternatively, trigger circuit 44 compares the VDD bus voltage to the reference voltage and generates a TRIGGER signal in proportion to the difference between the VDD bus voltage and the reference voltage. An overvoltage event, such as an EOS/ESD event may increase the voltage on VDD bus 14 and the voltage on BOOST bus 12. The TRIGGER signal may have a voltage that is proportional to the voltage level of an overvoltage event. In other words, the higher the difference between the BOOST/VDD bus voltage and the reference voltage, the harder the clamp transistors turn on. The TRIGGER signal is provided to the gate terminals of clamp transistors 32 and 42 via TRIGGER bus 16. In response, clamp transistors 32 and 42 are turned on and thus shunt current between VDD bus 14 and VSS bus 20 during an EOS/ESD event. Although FIG. 1 shows a single trigger circuit 44 providing the TRIGGER signal to clamp transistors 32 and 42, overvoltage protection circuit 10 may include additional trigger circuits. By way of example, each clamp transistor may receive a TRIGGER signal from its own trigger circuit or a group of clamp transistors may receive a TRIGGER signal from a common trigger circuit. In an instance where each clamp transistor receives a TRIGGER signal from its own trigger circuit, there may not be any need for TRIGGER bus 16. Furthermore, in one embodiment, reference voltage generator 22 may be placed in a corner of the integrated circuit. Although FIG. 1 shows a specific type of components arranged in a certain manner, it may include other types of components arranged differently.

The overvoltage protection circuit 10 of FIG. 1 may use elements of a boosted rail clamp network designed for unpowered ESD protection, such as described in U.S. Pat. No. 6,724,603, which is incorporated in its entirety by reference. During certain ESD events, such as an ESD event causing an ESD current with positive polarity to flow into an I/O pad, for example I/O pad 24, BOOST bus 12 may supply a higher voltage to trigger circuit 44 than the VDD bus 14 could provide. This is because the voltage drop across diode 26 may be significantly smaller than the voltage drop across diode 28, which carries the largest portion of the ESD current (it being the primary ESD current path). Since diode 26 needs to pull up only BOOST bus 12, it may carry significantly less current as it is not in the primary ESD current path and therefore carries only a little current. Being powered by BOOST bus 12 may therefore enable the trigger circuit to provide a higher voltage level on TRIGGER bus 16 compared to a case where the trigger circuit was powered by the VDD bus 14. The higher voltage on the TRIGGER bus may provide a higher gate terminal voltage for clamp transistors 32 and 42, which in-turn may reduce their on-resistance and thereby improving the ESD performance of protection circuit 10. Although FIG. 1 shows a preferred embodiment using a boosted rail clamp network, other embodiments may use other rail clamp network configurations, for example a non-boosted configuration in which BOOST bus 12 and diodes 26 and 36 are omitted and trigger circuit 44 is powered by VDD bus 14 instead of being powered by BOOST bus 12.

Figure 2:
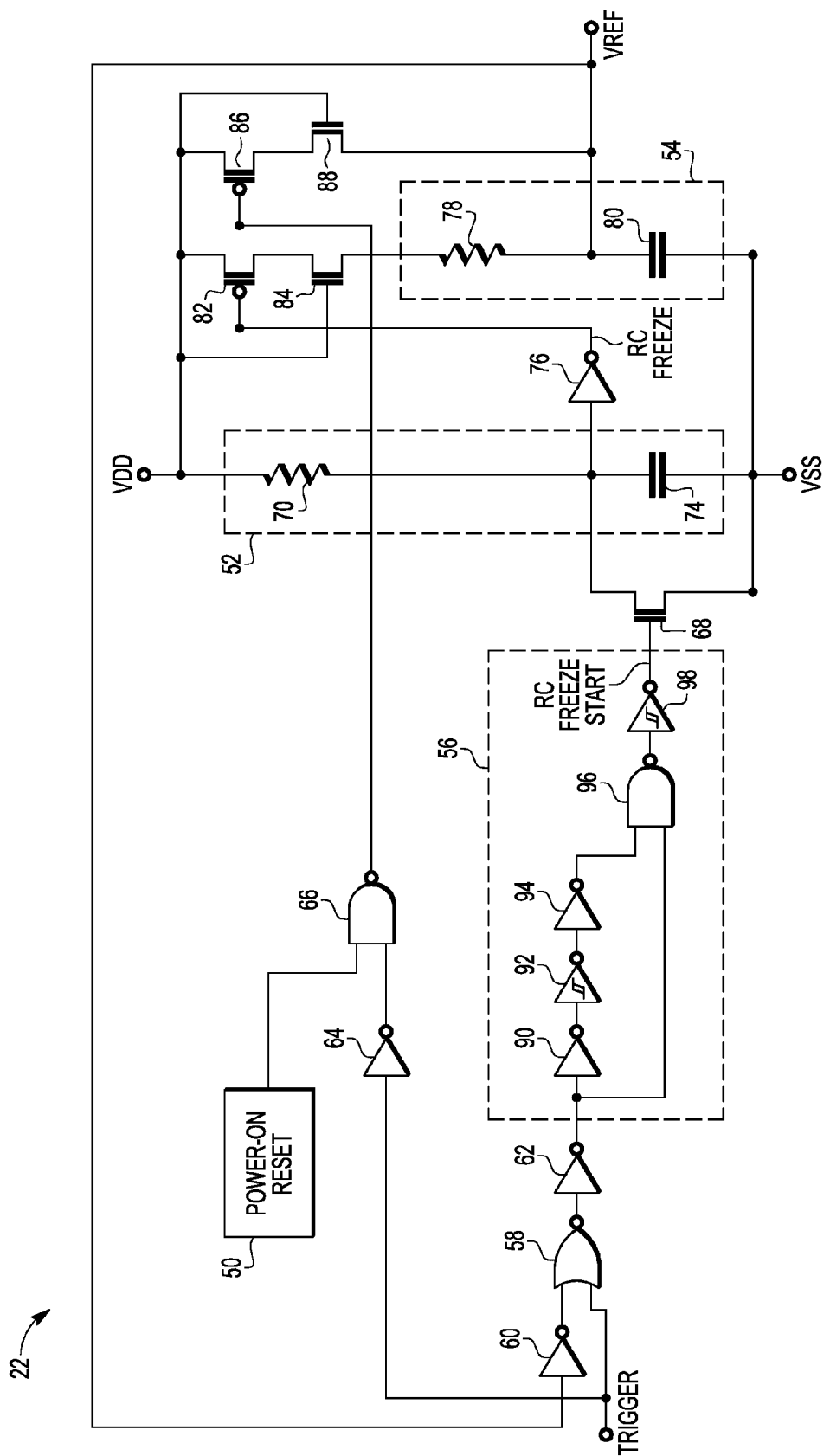
FIG. 2 is a schematic diagram showing an exemplary reference voltage generator for use with the overvoltage protection circuit of FIG. 1.

FIG. 2 is a schematic diagram showing an exemplary reference voltage generator 22 for use with overvoltage protection circuit 10 of FIG. 1. In one embodiment, the circuit nodes of FIG. 2 labeled as "VDD," "VSS," "TRIGGER," and "VREF" may be coupled to VDD bus 14, VSS bus 20, TRIGGER bus 16, and VREF bus 18, respectively. Reference voltage generator 22 may include a power-on reset circuit 50, a timer circuit 52, a filter circuit 54, and an edge detector circuit 56. Timer circuit 52 may include a resistor 70 and a capacitor 74. Filter circuit 54 may include a resistor 78 and a capacitor 80. As an example, capacitors 74 and/or capacitor 80 may be implemented as n-type transistors utilizing the capacitance between the gate terminal and the current electrodes thereof. Reference voltage generator 22 may further include a NOR gate 58, an inverter 60, and an inverter 62. Reference voltage generator 22 may further include an inverter 64 and a NAND gate 66. Inverter 64 and NOR gate 58 may have switch-points closer to the VSS node voltage. Reference voltage generator 22 may include n-type transistors 68, 84, and 88. Reference voltage generator 22 may further include p-type transistors 82 and 86. The output of inverter 76, labeled as the RC FREEZE signal, is coupled to the gate terminal of p-type transistor 82. One current terminal of p-type transistor 82 is coupled to the VDD node and the other current terminal of p-type transistor 82 is coupled to one of the current terminals of n-type transistor 84. The gate terminal of n-type transistor 84 is coupled to the VDD node. The other current terminal of n-type transistor 84 is coupled to a terminal of resistor 78, which is part of filter circuit 54. The output of NAND gate 66 is coupled to the gate terminal of p-type transistor 86. One current terminal of p-type transistor 86 is coupled to the VDD node and the other current terminal of p-type transistor 86 is coupled to one of the current terminals of n-type transistor 88. The gate terminal of n-type transistor 88 is coupled to the VDD node. The other current terminal of n-type transistor 88 is coupled to the VREF node.

In one embodiment, timer circuit 52 may be used to deactivate filter circuit 54 for a specific period of time. As an example, when the TRIGGER signal is applied at an input of NOR gate 58, the output is received by inverter 62 and the output of inverter 62 is received by edge detector circuit 56. Edge detector circuit 56, in turn, generates a pulse, labeled as RC FREEZE START. By way of example, the purpose of generating the RC FREEZE START signal as a pulse/spike is to create a discharge path for a capacitor associated with a resistor-capacitor (RC) timer (e.g., the RC timer formed using resistor 70 and capacitor 74). The time it takes for capacitor 74 to recharge via resistor 70 provides a timer function. In one embodiment, edge detector circuit 56 includes inverters 90 and 94, Schmitt triggers 92 and 98, and NAND gate 96. In this example, edge detector circuit 56 utilizes a three inverter delay stage to generate a brief voltage pulse at its output when a rising edge is detected on its input. Alternately, edge detector circuit 56 may have additional inverter delay stages, as long as the total number of inverter delay stages is odd. Inverter 90 may have a switch-point closer to the VSS node voltage and inverter 94 may have a switch-point closer to the VDD node voltage.

Referring still to FIG. 2, the RC FREEZE START pulse turns on transistor 68. This starts the timer formed by timer circuit 52. By way of example, capacitor 74 of timer circuit 52 discharges through the path to the VSS node via transistor 68. This results in the signal, labeled as RC FREEZE, at the output of inverter 76, to go high. The high RC FREEZE signal turns off p-type transistor 82, which then de-activates filter circuit 54 and ensures that the VREF node voltage is kept frozen (i.e., the VREF node voltage level is maintained) during an EOS/ESD event. Once the RC FREEZE START pulse transitions to a low voltage, transistor 68 is turned off thereby stopping the discharge of capacitor 74. Capacitor 74 then begins to charge via the path to the VDD node, for example, through resistor 70. Once capacitor 74 is charged up again to a level greater than the switch-point of inverter 76, inverter 76 outputs a low signal. This, in turn, causes the RC FREEZE signal to go low. The low RC FREEZE pulse turns on p-type transistor 82. This in turn re-activates filter circuit 54 and "un-freezes" the VREF node voltage. Inverter 76 may have a switch-point closer to the VDD node voltage. The skew in the switch-point helps increase the on time of timer circuit 52. As an example, the RC time constant of timer circuit 52 may be 4 microseconds or longer. Filter circuit 54 provides the VREF node voltage at its output. As an example, the RC time constant of filter circuit 54 may be 10 microseconds or longer. N-type transistors 84 and 88 prevent capacitor 80 from losing charge during certain EOS/ESD events in which the VDD node voltage is pulled below the VREF node voltage, and thereby transistors 84 and 88 prevent the VREF node voltage from dropping. Without n-type transistors 84 or 88, capacitor 80 may lose charge through the parasitic drain-body diodes of p-type transistors 82 and 86, respectively, causing the VREF node voltage to drop. In a preferred embodiment of this invention, n-type transistors 84 and 88 may have a threshold voltage that is approximately zero or below zero to ensure that there is little additional voltage drop across these transistors when capacitor 80 gets charged up via p-type transistor 82 and resistor 78 or via p-type transistor 86.

Referring still to FIG. 2, power-on reset circuit 50 has a POR output signal, which is high during power-on and during an un-powered ESD event. As an example, power-on reset circuit 50 may be implemented to detect a voltage ramp, ramping up from the VSS node voltage, on the VDD node. If the POR output signal is high and the TRIGGER signal is low, the output of NAND gate 66 is low. This ensures that p-type transistor 86 is turned on. This forces the VREF node voltage to track the VDD node voltage during a regular power-on event and ensures that a power-on event is not falsely viewed as an EOS/ESD event. If the POR output and TRIGGER signals are high at the same time, indicative of an un-powered ESD event, the output of NAND gate 66 is high keeping p-type transistor 86 turned off. This keeps the VREF node voltage low as the filter circuit 54 will prevent the VREF node voltage from rising quickly. This may aid the trigger circuit to stay on during an un-powered ESD event if the VDD node voltage stays above the VREF node voltage for the duration of the ESD event. In this mode of operation, the overvoltage on the VDD node with respect to the VREF node is detected in trigger circuit 44 in a similar way as during a powered EOS/ESD event and therefore keeps the TRIGGER signal at a higher voltage level and the clamping devices turn on. In one embodiment, the VREF node is also coupled to the input of inverter 60. Inverter 60 may have a switch-point closer to the VDD node voltage. The output of inverter 60 is coupled to an input of NOR gate 58. This ensures that, when the TRIGGER signal voltage is too low to switch NOR gate 58 (i.e., the TRIGGER signal voltage is below the switch point of NOR gate 58, such as during a weak EOS/ESD event), reference voltage generator 22 is still able to "freeze" the VREF node voltage. When the VREF node voltage is lower than the VDD node voltage by approximately a threshold voltage of the p-type transistor of the heavily skewed inverter 60 (as it may be the case during an EOS/ESD event), inverter 60 produces a high output signal and NOR gate 58 produces a low output signal. This switches the output of inverter 62 to a high voltage and edge detector 56 produces a voltage pulse on the RC FREEZE START node which starts timer 52. This "freezes" filter circuit 54 for the duration of the on-time of the timer circuit. Although FIG. 2 includes two modes of activating timer circuit 52, one that detects a voltage level on the TRIGGER node with respect to the VSS node and another one that detects a voltage level on the VREF node with respect to the VDD node, other embodiments of this invention may use only one of these two modes. As an example, where only the TRIGGER detection mode is used, the TRIGGER signal may be provided as a direct input to edge detector 56, and inverters 60 and 62 and NOR gate 58 may be omitted. As another example, where only the VREF detection mode is used, the output of inverter 60 may be provided as a direct input to edge detector 56, and NOR gate 58 and inverter 62 may be omitted. As yet another example, a different mode of activating timer 52 may be used that utilizes a logic signal generated by trigger circuit 44 and provided as an input to edge detector 56. This logic signal may be made available to VREF generator 22 via an additional signaling bus (not shown in FIG. 1) and the signaling bus may change its logic state when the trigger circuit detects an EOS/ESD event.

Figure 3:
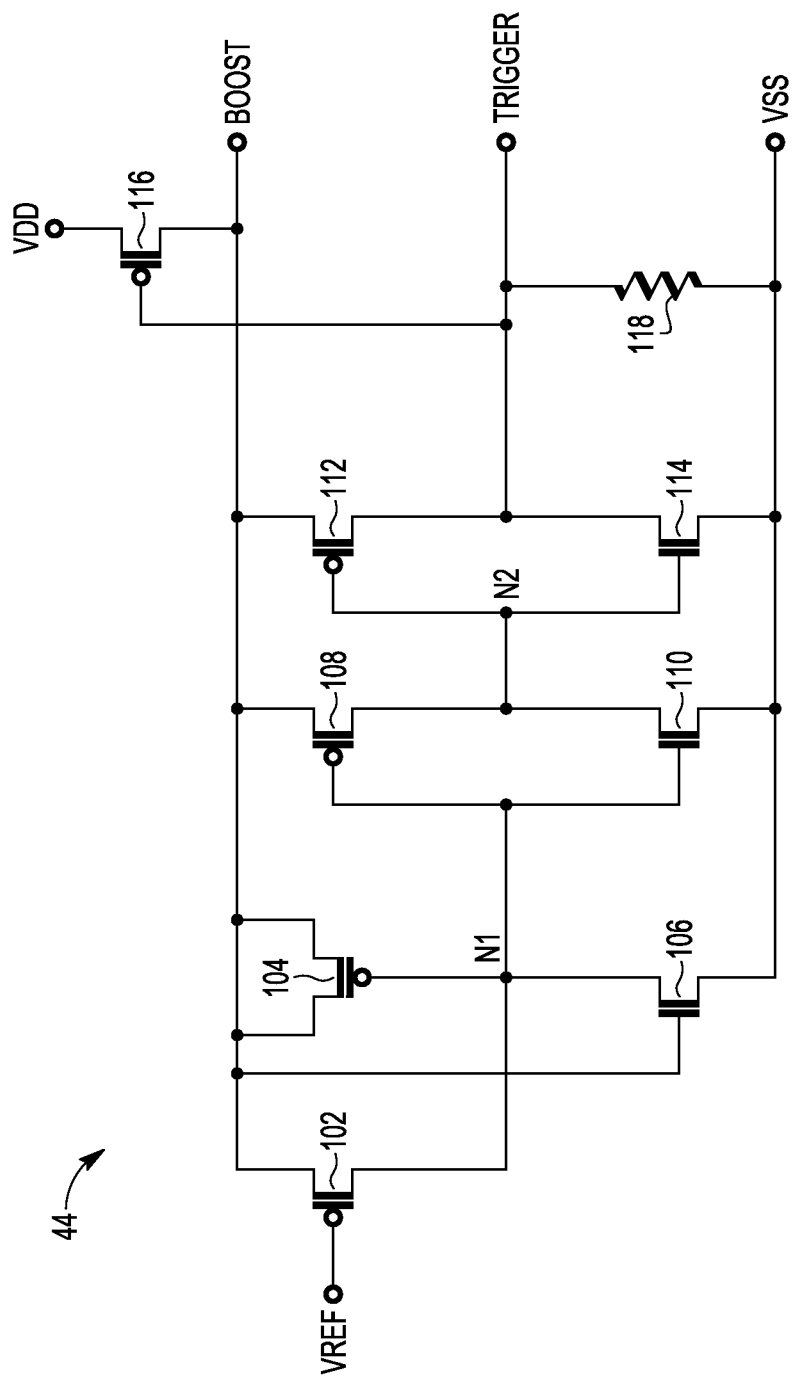
FIG. 3 is a schematic diagram showing an exemplary trigger circuit for use with the overvoltage protection circuit of FIG. 1.

FIG. 3 is a schematic diagram showing an exemplary trigger circuit 44 for use with overvoltage protection circuit 10 of FIG. 1. In one embodiment the circuit nodes of FIG. 3 labeled as "VDD", "VSS", "TRIGGER", "BOOST", and "VREF" may be coupled to VDD bus 14, VSS bus 20, TRIGGER bus 16, BOOST bus 12, and VREF bus 18, respectively. Trigger circuit 44 may generate a TRIGGER signal based on a comparison between the BOOST node voltage and the VREF node voltage. Trigger circuit 44 may include p-type transistors 102, 104, 108, 112, and 116. Trigger circuit 44 may further include n-type transistors 106, 110, and 114. Trigger circuit 44 may further include a resistor 118. By way of example, the VREF node voltage may be coupled to a gate terminal of p-type transistor 102. One terminal of p-type transistor 102 (source terminal) may be coupled to the BOOST node. Alternatively, this same terminal of p-type transistor 102 may be coupled to the VDD node. The other terminal of p-type transistor 102 may be coupled to the gate terminal of p-type transistor 104 to form node N1. P-type transistor 104 may be coupled to act as a capacitor. In particular, the two terminals of p-type transistor 104 may be coupled to the BOOST node. The gate terminal of n-type transistor 106, which is configured to act as a resistor, may be coupled to the BOOST node. One terminal of n-type transistor 106 may be coupled to the gate terminal of p-type transistor 104 and the other terminal of n-type transistor 106 may be coupled to the VSS node. The gate terminals of p-type transistor 108 and n-type transistor 110 may be coupled to each other and further be coupled to the gate terminal of p-type transistor 104 (node N1). One terminal of p-type transistor 108 may be coupled to the BOOST node. Another terminal of p-type transistor 108 may be coupled to a terminal of n-type transistor 110 forming node N2. The other terminal of n-type transistor 110 may be coupled to the VSS node. P-type transistor 108 and n-type transistor 110 may form a first inverter stage. The terminals of p-type transistor 108 and n-type transistor 110 that are coupled to each other at node N2 may further be coupled to the gate terminals of p-type transistor 112 and n-type transistor 114. One terminal of p-type transistor 112 may be coupled to the BOOST node. One terminal of n-type transistor 114 may be coupled to the VSS node. Another terminal of p-type transistor 112 may be coupled to another terminal of n-type transistor 114 to provide the TRIGGER signal. P-type transistor 112 and n-type transistor 114 may form a second inverter stage. The gate terminal of p-type transistor 116 may be coupled to the TRIGGER node. One terminal of p-type transistor 116 may be coupled to the VDD node and the other terminal of p-type transistor 116 may be coupled to the BOOST node. One terminal of resistor 118 may be coupled to the TRIGGER node and the other terminal of resistor 118 may be coupled to the VSS node.

During a powered EOS/ESD event, p-type transistor 102 pulls up node N1 if the BOOST node voltage goes above the VREF node voltage by more than a threshold voltage of p-type transistor 102. This causes the voltage at node N1 to be pulled up. At the same time, however, n-type transistor 106 is also on and it tries to pull down node N1. Regardless, as the voltage difference between the BOOST node voltage and the substantially constant VREF node voltage increases, node N1 is pulled up to a voltage that results in bringing node N2 down to a lower voltage. In effect, the rise in the voltage at node N1 turns on the TRIGGER signal via the two consecutive inverter stages, including p-type transistors 108 and 112 and n-type transistors 110 and 114. The TRIGGER signal activates clamp transistors 32 and 42 and limits the VDD node voltage to a voltage that is approximately the sum of the VREF node voltage and the source-gate voltage of p-type transistor 102. As explained above, reference voltage generator 22 keeps the VREF node voltage "frozen" at a predetermined voltage (e.g., 5 volts) during an EOS/ESD event. This in turn prevents the VDD node voltage from rising excessively. In one embodiment, trigger circuit 44 ensures that the magnitude of the TRIGGER signal is proportional to the difference between the BOOST node voltage and the VREF node voltage. P-type transistor 102 and n-type transistor 106, which may be configured as an always-on resistive ballast device, form an inverter stage with a certain voltage amplification gain. Likewise p-type transistor 108 and n-type transistor 110 as well as p-type transistor 112 and n-type transistor 114 form inverter stages with certain voltage amplification gains. The combined voltage gain of these three inverter stages determines how much the voltage at the TRIGGER node rises as a function of the difference between the BOOST and VREF node voltages. Referring back to FIG. 1, the turn-on behavior of trigger circuit 44 defines an active feedback loop that resists a voltage increase on the BOOST/VDD nodes above the VREF node by activating the clamp transistors, which counteract the VDD bus voltage increase by shunting current from VDD bus 14 to VSS bus 20. The gain of this active feedback loop determines by how much the voltage, on BOOST bus 12 or VDD bus 14, may rise at a given level of EOS/ESD overstress current injected into overvoltage protection circuit 10, for example, via I/O pad 24.

P-type transistor 116 actively couples the BOOST node to the VDD node when the voltage at the TRIGGER node is below the BOOST node voltage. This ensures that during normal powered-on operation of the integrated circuit, when the voltage at the TRIGGER node is at VSS node potential and the rail clamps are turned off, the BOOST node and the VDD node are approximately at the same potential. Therefore, in embodiments of FIG. 1 where voltage reference generator 22 utilizes a filter to derive the VREF bus voltage from the VDD bus voltage, the VREF bus voltage also represents a filtered BOOST bus voltage. During an EOS/ESD event, either powered or un-powered, the BOOST bus voltage may exceed the VDD bus voltage with the benefit of providing a higher supply voltage for the trigger circuit, which may therefore be able to turn on the rail clamps harder as already described earlier. Using a filtered VDD bus voltage to generate the VREF bus voltage (in voltage reference generator 22) while using the difference between the BOOST and VREF bus voltages to generate the TRIGGER bus voltage in trigger circuit 44 is therefore a preferred embodiment of this invention. In another embodiment the VREF bus voltage may be generated from a filtered BOOST bus voltage instead of a filtered VDD bus voltage. In yet another embodiment the difference between the VDD and VREF bus voltages instead of the difference between the BOOST and VREF bus voltages may be used to generate the TRIGGER bus voltage.

The trigger circuit 44 of FIG. 3 may also detect un-powered ESD events and may, as a result, turn on the rail clamps by increasing the voltage at the TRIGGER node. P-type transistor 104 is configured as a capacitive device and n-type transistor 106 is configured as a resistive device. Together, transistors 104 and 106 form an RC filter stage with output node N1. This RC filter stage in combination with the inverter stages coupled to the RC filter stage form a slew rate detection circuit. During un-powered ESD events, the trigger circuit may only turn on when the slew rate of the waveform corresponding to the BOOST node voltage exceeds a specified minimum ESD slew rate, which may depend on the RC time constant of the RC filter stage. Having a trigger circuit that can detect both powered and un-powered EOS/ESD events and that combines a substantial amount of required circuit elements for these two different event types, may pose an advantage. The trigger circuit 44 shown in FIG. 3 may be implemented in a smaller layout area on the integrated circuit than two separate trigger circuits, one for detecting powered, the other one for detecting un-powered EOS/ESD events. A similar layout area benefit may also arise from the fact that, in certain examples of the present invention, rail clamp transistors 32 and 42 as well as diodes 26, 28, 30, 36, 38, and 40 are utilized for protection against both powered and un-powered EOS/ESD events.

Figure 4:
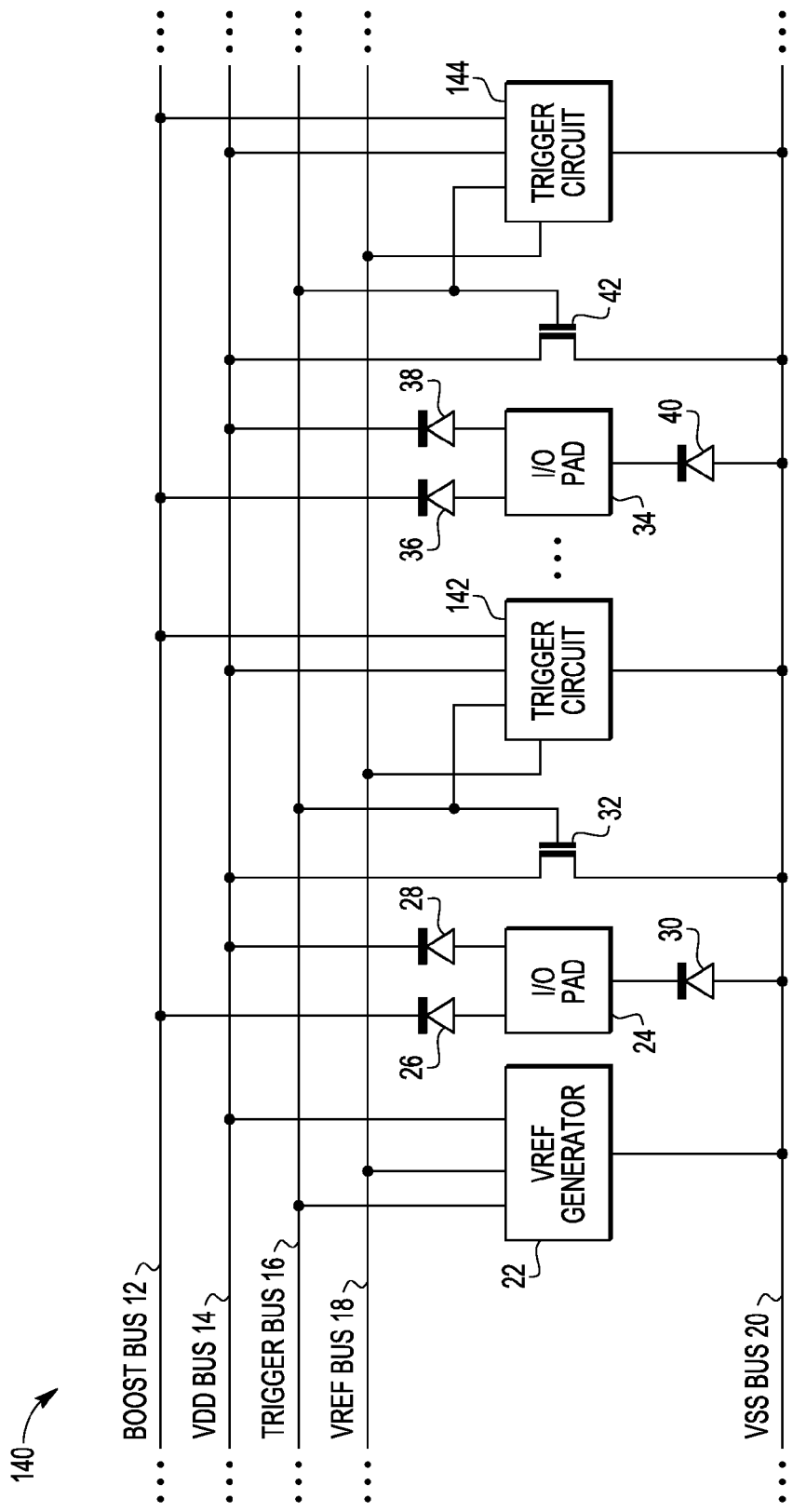
FIG. 4 is a block diagram of another exemplary overvoltage protection circuit for an integrated circuit.

FIG. 4 is a block diagram of another exemplary overvoltage protection circuit 140. Like overvoltage protection circuit 10, overvoltage protection circuit 140 includes various components for overvoltage protection. Overvoltage protection circuit 140 has some of the same components as overvoltage protection circuit 10. The common components are not described in detail, since they have already been described with respect to FIGS. 1-3. By way of example, overvoltage protection circuit 140 includes a reference voltage generator 22, which is described above with respect to FIGS. 1 and 2. In addition, overvoltage protection circuit 140 includes trigger circuits 142 and 144. Trigger circuits 142 and 144 may be implemented in similar fashion as trigger circuit 44 described above with respect to FIG. 3. In this embodiment, each of the clamp transistors 32 and 42 has its own corresponding trigger circuit. Thus, for example, trigger circuit 142 provides the TRIGGER signal to clamp transistor 32 and trigger circuit 144 provides the TRIGGER signal to clamp transistor 42. As shown, each trigger circuit provides a TRIGGER signal that is coupled to a gate terminal of respective clamp transistors 32 and 42. In terms of the operation of overvoltage protection circuit 140, it operates in the same manner as overvoltage protection circuit 10. Although FIG. 4 shows each clamp transistor having its own respective trigger circuit, a group of clamp transistors may share a trigger circuit.

In a preferred embodiment of this invention, the transistors used in the circuits shown herein are assumed to have their body (well) terminals coupled to power supplies. In particular, n-type transistors are assumed to have their body terminal coupled to the VSS bus while p-type transistors are assumed to have their body terminal coupled to the VDD bus or BOOST bus. In other embodiments the body terminals may be coupled to internal circuit nodes or biased actively by biasing circuits not shown herein.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

It is to be understood that the circuits depicted herein are merely exemplary. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An overvoltage protection circuit comprising:
   a reference voltage generator for providing a reference voltage that is relatively constant during an overvoltage event, wherein the reference voltage generator comprises:
      a first filter circuit for filtering transients in a voltage signal on the first power supply terminal; and
      a timer circuit coupled to the first filter circuit, the timer circuit for maintaining the reference voltage for a predetermined time period;
   a trigger circuit coupled to receive the reference voltage and a first power supply voltage, the trigger circuit for comparing the reference voltage to the first power supply voltage, and in response to detecting that the first power supply voltage is above the reference voltage, the trigger circuit providing a trigger signal having a voltage proportional to a voltage level of the overvoltage event; and
   a clamping device coupled between a first power supply terminal and a second power supply terminal, the clamping device for providing a current path between the first and second power supply terminals in response to the trigger signal.

2. The overvoltage protection circuit of claim 1, wherein the overvoltage event is characterized as being an overstress voltage to a powered integrated circuit device.

3. The overvoltage protection circuit of claim 1, wherein the first filter circuit and the timer circuit each comprises a resistor-capacitor (RC) circuit.

4. The overvoltage protection circuit of claim 1, wherein the timer circuit comprises:
   a resistive element having a first terminal coupled to the first power supply terminal, and a second terminal; and
   a capacitive element having a first plate electrode coupled to the second terminal of the resistive element, and a second plate electrode coupled to the second power supply terminal.

5. The overvoltage protection circuit of claim 4 further comprising:
a transistor having a first current electrode coupled to the first plate electrode of the capacitive element, a control electrode, and a second current electrode coupled to the second power supply terminal; and
an edge detector having an input coupled to receive a signal indicative of the overvoltage event, and an output coupled to the control electrode of the transistor, the edge detector for generating a pulse for starting the predetermined time period.

6. The overvoltage protection circuit of claim 1, wherein the overvoltage protection circuit further comprises:
a plurality of input/output pads; and
a plurality of trigger circuits, each of the plurality of trigger circuits corresponding to a predetermined number of the plurality of input/output pads.

7. An overvoltage protection circuit comprising:
a reference voltage generator for providing a reference voltage that is relatively constant during an overvoltage event;
a trigger circuit coupled to receive the reference voltage and a first power supply voltage, the trigger circuit for comparing the reference voltage to the first power supply voltage, and in response to detecting that the first power supply voltage is above the reference voltage, the trigger circuit providing a trigger signal having a voltage proportional to a voltage level of the overvoltage event, wherein the trigger circuit comprises:
a third power supply terminal and a fourth power supply terminal;
a capacitive element having a first plate electrode coupled to the third power supply terminal, and a second plate electrode;
a resistive element having a first terminal coupled to the second plate electrode of the capacitive element, and a second terminal coupled to the fourth power supply terminal;
a transistor having a first current electrode coupled to the first plate electrode of the capacitive element, a control electrode for receiving the reference voltage, and a second current electrode coupled to the second plate electrode of the capacitive element; and
an inverter having an input terminal coupled to the second plate electrode of the capacitive element; and
a clamping device coupled between a first power supply terminal and a second power supply terminal, the clamping device for providing a current path between the first and second power supply terminals in response to the trigger signal.

8. An overvoltage protection circuit comprising:
a reference voltage generator for providing a reference voltage that is relatively constant during an overvoltage event;
a trigger circuit coupled to receive the reference voltage and a first power supply voltage, the trigger circuit for comparing the reference voltage to the first power supply voltage, and in response to detecting that the first power supply voltage is above the reference voltage, the trigger circuit providing a trigger signal having a voltage proportional to a voltage level of the overvoltage event;
a clamping device coupled between a first power supply terminal and a second power supply terminal, the clamping device for providing a current path between the first and second power supply terminals in response to the trigger signal; and
a power-on reset circuit for detecting a ramping up of a second power supply voltage, and in response, the power-on reset circuit for preventing the clamping device from providing the current path between the first and second power supply terminals.

9. An overvoltage protection circuit, comprising:
a reference voltage generator for providing a reference voltage that is a filtered voltage of a first power supply voltage, wherein the reference voltage generator comprises:
a resistor-capacitor circuit for filtering transients in the first power supply voltage; and
a timer circuit coupled to the resistor-capacitor circuit, the timer circuit for freezing the reference voltage for a predetermined time period;
a trigger circuit coupled to receive the reference voltage and a second power supply voltage, the trigger circuit for comparing the reference voltage to the second power supply voltage, and in response to detecting that the second power supply voltage is above the reference voltage, the trigger circuit providing a trigger signal having a voltage proportional to a voltage level of an overvoltage event; and
a clamping device having a first terminal coupled to a first power supply terminal, a second terminal coupled to a second power supply terminal, and a control terminal coupled to receive the trigger signal, the clamping device for providing a current path between the first and second power supply terminals in response to the trigger signal.

10. The overvoltage protection circuit of claim 9, wherein the timer circuit comprises:
a resistive element having a first terminal coupled to the first power supply terminal, and a second terminal; and
a capacitive element having a first plate electrode coupled to the second terminal of the resistive element, and a second terminal coupled to the second power supply terminal.

11. The overvoltage protection circuit of claim 9, wherein the trigger circuit comprises:
a third power supply terminal and a fourth power supply terminal;
a capacitive element having a first plate electrode coupled to the third power supply terminal, and a second plate electrode;
a resistive element having a first terminal coupled to the second plate electrode of the capacitive element, and a second terminal coupled to the fourth power supply terminal;
a transistor having a first current electrode coupled to the first plate electrode of the capacitive element, a control electrode for receiving the reference voltage, and a second current electrode coupled to the second plate electrode of the capacitive element; and
an inverter having an input terminal coupled to the second plate electrode of the capacitive element.

12. The overvoltage protection circuit of claim 9, wherein the overvoltage protection circuit further comprises:
a plurality of input/output terminals; and
a plurality of trigger circuits, each of the plurality of trigger circuits corresponding to a predetermined number of the plurality of input/output terminals.

13. The overvoltage protection circuit of claim 9 further comprising a power-on reset circuit for detecting a ramping up of the first power supply voltage, and in response, the power-on reset circuit for preventing the clamping device from providing the current path between the first and second power supply terminals.

14. An overvoltage protection circuit, comprising:
- a plurality of input/output terminals;
- a plurality of trigger circuits, each of the plurality of trigger circuits corresponding to a predetermined number of the plurality of input/output terminals, wherein each of the trigger circuits is coupled to receive a reference voltage and a first power supply voltage, the trigger circuit for comparing the reference voltage to the first power supply voltage, and in response to detecting that the first power supply voltage is above the reference voltage, each of the trigger circuits providing a trigger signal having a voltage proportional to a voltage level of the overvoltage event;
- a plurality of clamping devices, each of the plurality of clamping devices having a first terminal coupled to a first power supply terminal, a second terminal coupled to a second power supply terminal, and a control terminal coupled to receive the trigger signal, the plurality of clamping devices for providing a current path between the first and second power supply terminals in response to the trigger signal; and
- a reference voltage generator for providing the reference voltage, the reference voltage being a filtered voltage of a voltage signal on the first power supply terminal, wherein the reference voltage generator comprises:
  - a resistor-capacitor circuit for filtering transients in the voltage signal on the first power supply terminal; and
  - a timer circuit coupled to the resistor-capacitor circuit, the timer circuit for freezing the reference voltage for a predetermined time period.

15. The overvoltage protection circuit of claim 14, wherein the timer circuit comprises:
- a resistive element having a first terminal coupled to the first power supply terminal, and a second terminal; and
- a capacitive element having a first plate electrode coupled to the second terminal of the resistive element, and a second terminal coupled to the second power supply terminal.

16. The overvoltage protection circuit of claim 14, wherein each of the plurality of trigger circuits comprises:
- a third power supply terminal and a fourth power supply terminal;
- a capacitive element having a first plate electrode coupled to the third power supply terminal, and a second plate electrode;
- a resistive element having a first terminal coupled to the second plate electrode of the capacitive element, and a second terminal coupled to the fourth power supply terminal;
- a transistor having a first current electrode coupled to the first plate electrode of the capacitive element, a control electrode for receiving the reference voltage, and a second current electrode coupled to the second plate electrode of the capacitive element; and
- an inverter having an input terminal coupled to the second plate electrode of the capacitive element.

* * * * *